(12) United States Patent
Hutner et al.

(10) Patent No.: US 9,959,186 B2
(45) Date of Patent: May 1, 2018

(54) DEBUGGING IN A SEMICONDUCTOR DEVICE TEST ENVIRONMENT

(71) Applicants: Marc Reuben Hutner, Toronto (CA); John F. Rowe, Natick, MA (US)

(72) Inventors: Marc Reuben Hutner, Toronto (CA); John F. Rowe, Natick, MA (US)

(73) Assignee: Teradyne, Inc., North Reading, MA (US)

( * ) Notice: Subject to any disclaimer, the term of this patent is extended or adjusted under 35 U.S.C. 154(b) by 111 days.

(21) Appl. No.: 13/680,407

(22) Filed: Nov. 19, 2012

(65) Prior Publication Data
US 2014/0143600 A1    May 22, 2014

(51) Int. Cl.
*G06F 11/36* (2006.01)
*G06F 11/273* (2006.01)
(Continued)

(52) U.S. Cl.
CPC ........ *G06F 11/2733* (2013.01); *G01R 31/319* (2013.01); *G01R 31/31705* (2013.01);
(Continued)

(58) Field of Classification Search
CPC ............. G06F 11/2294; G06F 11/2733; G06F 11/362; G06F 11/263; G01R 31/319; G01R 31/31705; G01R 31/31707
(Continued)

(56) References Cited

U.S. PATENT DOCUMENTS 4,894,829 A * 1/1990 Monie ............. G01R 31/31912
702/123
5,668,745 A * 9/1997 Day ............... G01B 31/318307
702/121
(Continued)

FOREIGN PATENT DOCUMENTS

| KR | 10-2012-0023601 A | 3/2012 |
| TW | I328164 B | 8/2010 |
| TW | I363257 B | 5/2012 |

OTHER PUBLICATIONS

Microsoft Corporation, Microsoft Computer Dictionary, 2002, Microsoft Press, Fifth Edition, p. 253.*
(Continued)

*Primary Examiner* — Paul Contino
(74) *Attorney, Agent, or Firm* — Wolf, Greenfield & Sacks, P.C.

(57) ABSTRACT

A test system that enables real-time interactive debugging of a device under test (DUT) using native customer code. A translation module may format, in real time, debug commands, corresponding to a user input, into a format recognizable by instruments in a tester. The user input may be a test program or test instructions written in a high-level programming language. The translation module may translate the user's debug commands into lower-level test instrument commands, based on which the tester may apply control signals to a processor in the DUT to test subsystems of the DUT. A result of the test may be provided to the
(Continued)

translation module, which may, in real time, format another debug command, or provide an indication of the result to the user. The translation module may thus enable a user to step-through and modify native customer code in an interactive manner to debug a DUT.

26 Claims, 6 Drawing Sheets

(51) Int. Cl.
```
G06F 11/22      (2006.01)
G06F 11/263     (2006.01)
G01R 31/317     (2006.01)
G01R 31/319     (2006.01)
```
(52) U.S. Cl.
CPC .... *G01R 31/31707* (2013.01); *G06F 11/2294* (2013.01); *G06F 11/263* (2013.01); *G06F 11/362* (2013.01)

(58) Field of Classification Search
USPC .............................................. 714/27, 32, 34
See application file for complete search history.

(56) References Cited

U.S. PATENT DOCUMENTS

| | | | | |
|---|---|---|---|---|
| 6,134,707 | A * | 10/2000 | Herrmann | G06F 17/5054 709/208 |
| 6,182,258 | B1 | 1/2001 | Hollander | |
| 6,449,744 | B1 * | 9/2002 | Hansen | G01R 31/318307 714/33 |
| 6,622,272 | B1 * | 9/2003 | Haverkamp | G01R 31/31905 714/724 |
| 6,681,351 | B1 * | 1/2004 | Kittross | G01B 31/318307 702/119 |
| 6,941,504 | B2 * | 9/2005 | Berry et al. | 714/758 |
| 6,973,607 | B2 * | 12/2005 | Baier et al. | 714/724 |
| 7,069,526 | B2 | 6/2006 | Schubert et al. | |
| 7,085,980 | B2 * | 8/2006 | Martin-de-Nicolas et al. | 714/736 |
| 7,107,173 | B2 * | 9/2006 | Fritzsche | G01R 31/31907 702/122 |
| 7,139,949 | B1 * | 11/2006 | Jennion | G06F 11/2236 702/118 |
| 7,376,876 | B2 * | 5/2008 | Raul | G01R 31/318307 714/738 |
| 7,996,827 | B2 | 8/2011 | Vorbach et al. | |
| 8,195,419 | B2 | 6/2012 | Teradyne | |
| 8,639,981 | B2 * | 1/2014 | Chong | 714/30 |
| 8,806,453 | B1 * | 8/2014 | Bodkin | G06F 8/31 717/114 |
| 2002/0193980 | A1 * | 12/2002 | Higashi | G01R 31/31705 703/26 |
| 2003/0115517 | A1 * | 6/2003 | Rutten | G01R 1/07314 714/718 |
| 2005/0261856 | A1 * | 11/2005 | Kushnick | G01R 31/31907 702/117 |
| 2006/0074625 | A1 * | 4/2006 | Maeda | G06F 8/20 704/8 |
| 2006/0200718 | A1 * | 9/2006 | Halliday | G01R 31/2815 714/727 |
| 2006/0212760 | A1 * | 9/2006 | Swoboda | 714/38 |
| 2006/0242504 | A1 * | 10/2006 | Kadota | G01R 31/31907 714/725 |
| 2006/0248390 | A1 * | 11/2006 | Hori | G01R 31/318314 714/28 |
| 2007/0250570 | A1 * | 10/2007 | Van Eyck | G06F 8/71 709/204 |
| 2007/0262879 | A1 * | 11/2007 | Greiner | H04L 12/66 340/870.21 |
| 2007/0266288 | A1 * | 11/2007 | Volkerink | G01R 31/31907 714/738 |
| 2008/0021669 | A1 * | 1/2008 | Blancha | G01R 31/2834 702/122 |
| 2008/0126655 | A1 * | 5/2008 | Baier et al. | 710/301 |
| 2009/0055803 | A1 * | 2/2009 | Kondo | G01R 31/31705 717/126 |
| 2009/0204849 | A1 * | 8/2009 | Shimura | G06F 11/263 714/27 |
| 2010/0235135 | A1 | 9/2010 | Teradyne | |
| 2010/0312516 | A1 | 12/2010 | Conner | |
| 2010/0313071 | A1 * | 12/2010 | Conner | G01R 31/31917 714/33 |
| 2011/0099424 | A1 * | 4/2011 | Rivera Trevino | G06F 11/263 714/25 |
| 2011/0276302 | A1 | 11/2011 | Teradyne | |
| 2012/0124441 | A1 * | 5/2012 | Teng | G11C 29/16 714/735 |
| 2013/0227367 | A1 * | 8/2013 | Czamara | G01R 31/3177 714/735 |
| 2014/0059382 | A1 * | 2/2014 | Atkinson et al. | 714/27 |

OTHER PUBLICATIONS

Evans, Andrew C. The New ATE: Protocol Aware. 2007. IEEE. IEEE International Test Conference.*
Kozma, Mike. Protocol Aware Introduction. Sep. 5, 2011. Verigy.*
Aslanian, John. Protocol-Aware ATE Digital Instruments. May 20, 2012 [retrieved on May 30, 2017]. Retrieved from the Internet:<URL:https://www.evaluationengineering.com/protocol-aware-ate-digital-instruments.php>.*
Molavi, Shawn, Andy Evans, and Ray Clancy. "Protocol aware test methodologies using today's ate." Asian Test Symposium, 2008. ATS'08. 17th. IEEE, 2008.*
Lydick, Hank. History and Future of Semiconductor ATE. 2012. National Instruments.*
Opgen-Rhein, Peter et al. Complex Test System for the Automated Test of Standard Software Modules. Jun. 2006. iSystem.*
iC5000: The Universal On-Chip Analyzer. Jul. 29, 2011. iSystem.*
International Search Report and Written Opinion for PCT/US2013/069215 dated Feb. 25, 2014.
Office Action for Chinese Patent Application 201380060064.4 dated Sep. 8, 2016.
Taiwanese Examination Report and English Translation thereof for Taiwan Application No. 102138432 dated Dec. 13, 2016.

* cited by examiner

DEBUGGING IN A SEMICONDUCTOR DEVICE TEST ENVIRONMENT

BACKGROUND

1. Field of the Invention

The invention relates generally to testing of electronic systems, such as system-on-chip semiconductor devices.

2. Related Art

Automatic test equipment (referred to generally as a "tester") is known for testing many types of electronic devices under test (DUTs). For example, testers for test printed circuit boards and semiconductor devices are known.

In some scenarios, testers are used during manufacture of the electronic devices. In this capacity, the testers are used to identify defects such that the results of testing can be used to impact the manufacture of a DUT by conditioning certain operations on the results of testing. For example, manufacturing steps that result in the device being packaged and shipped to a customer are typically performed only if testing on a device indicates that the device is working properly. If such tests indicate that the device is not working properly, the device is often diverted such that different operations to rework or scrap the device are performed.

Testers are typically configured to run test scenarios that emulate various real-world conditions that a DUT might experience in operation. Each test scenario, for example, may have a sequence of steps that activate or utilize different portions of the DUT that are involved in a particular usage scenario. The collection of test scenarios may be selected to ascertain whether all portions of the DUT have been manufactured correctly.

The tester may implement such test scenarios by executing one or more test programs. The test programs specify operations to be performed by the tester to generate stimulus signals and measure responses for comparison to a response expected from a properly operating device. Execution of a test program may entail application of a "test pattern" to control the circuitry that generates or measures digital signals at numerous test points connected to a DUT. The test pattern is a fixed binary data set indicating, for each of multiple successive tester cycles, whether an instrument in the tester is to generate or measure a test signal. The pattern may also indicate other information about the test signals, such as their digital values.

Testers are also used while a product device is being developed—test chip to validate specific product features. During development, a design engineer may use a tester to execute test programs. These test programs are designed to exercise portions of the DUT, and are often written to surface design flaws in the DUT. Test programs created for this purpose may be limited to testing small portions of the DUT at a time.

Often, the development process is iterative, with an engineer, whether developing the DUT or the test program creating a test program and then loading that test program into a tester. The test program may be executed with a DUT connected to the tester. Based on the results of executing the test program, changes may be made to the design of the DUT. Though, changes to the test program may also result. Changes may be made, for example, to address initial flaws in the test program or as part of an incremental design approach in which, once portions of the test program or DUT are validated, other portions that interact with those portions may be added.

As the test program is changed, it may be reloaded into the tester and further iterations of the process of executing the test program, evaluating the results, and modifying the test program may be performed. These iterations can be compounded if, during testing, a problem with the design of the DUT is identified, requiring changes to the design.

A test system might also be used after a device has been manufactured. For example, if multiple devices that have been manufactured and put into use are experience similar defects, a manufacturer of the device may want to test samples to determine whether the failures are related to a latent defect in the design or systemic defects in the manufacture of the devices. Such testing may also be performed by developing a test program, possibly iteratively, to identify the source of the defects.

SUMMARY

The inventors have recognized and appreciated that the time to bring new semiconductor devices to market may be accelerated by providing a test system with an interface to a debugger. The debug system may provide a user interface through which the user may, interactively, provide debug commands and receive results of applying test signals to a DUT that implement those debug commands. Those debug commands may, for example, allow a user to step through a test program and observe the results of applying each step in the program to the DUT, run the test program until a break point, specified by a debug command, is reached, or otherwise be based on a test program.

Such an interface may translate commands, derived based on the test program and the debug commands, into high level commands that may be processed by the test system. Processing by the test system may ultimately generate a test pattern and other instrument control signals on the fly. By using the debug system, a user may perform multiple operations without rewriting and reloading a test program. As a result, time to debug a DUT and/or a test program may be reduced Accordingly, in at least one aspect, the invention relates to at least one computer-readable storage medium comprising computer-executable instructions that, when executed on at least one processor of a computing device, implement a debug method comprising interactively receiving debug inputs from a user of the computing device and accessing a test program, the test program comprising a plurality of test program commands. The method may also comprise generating instrument commands configured to control instruments of a tester to stimulate a device under test (DUT) and receiving responses from the DUT in accordance with the debug inputs and the test program commands, and applying the instrument commands to instruments in the tester.

In another aspect, the invention may relate to a method of operating a test system. The method may comprise, with at least one debug tool, receiving user input and, in response to the user input, generating a plurality of debug commands. The method may also comprise receiving the plurality of debug commands at an interface, and within the interface, formatting, in real time, the plurality of debug commands for application to a test system, applying the formatted commands to the test system, and, within the test system, controlling one or more instruments to stimulate a device under test and measure responses of the device under test in accordance with the plurality of debug commands and protocol information associated with a device under test.

In other aspects, the invention may relate to a test apparatus. The test apparatus may comprise a plurality of instruments disposed within a tester, each of the instruments configured to generate and/or measure at least one signal for application to a device under test. The test apparatus may also comprise at least one processor configured to implement a debugger module, the debugger module comprising an interface, wherein the debugger module is configured to execute at least one debug tool in response to information received through the interface to generate debug commands. The test apparatus may also comprise a tester control module, the tester control module comprising an input, wherein the tester control module is configured to generate, in real time, control signals that control the plurality of instruments to generate and/or measure signals for application to the device under test based on instrument commands received through the input; and a translation module coupled between the debugger module and the tester control module, wherein the translation module is configured to receive a first set of debug commands from the debugger module, generate, based on the first set, a second set of instrument commands, and apply the second set to the input of the tester control module in real time in relation to receipt of the first set of debug commands.

The foregoing is a non-limiting summary of the invention, which is defined by the attached claims.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing.

In the drawings.

DETAILED DESCRIPTION

Using techniques described herein, a test system may be adapted to provide real-time, interactive debugging of a device under test (DUT). The system may leverage investment in a tester that a semiconductor device manufacturer might otherwise acquire for manufacturing testing of engineering work. Yet, such the tester may be used in a way that speeds semiconductor devices to market or facilitates identification and correction of design or systemic manufacturing defects of devices in comparison to conventional use of a tester.

In accordance with some embodiments, a customer may provide a test program, containing multiple test program commands. A debugger may, in response to debug inputs provided by a user, generate debug commands. These debug commands may be based on the test program commands, for example by indicating that test program commands should be executed at times or in ways determined by the debug inputs. Such debug commands may include stepping through the test program or executing the test program until a break point in the program or a trap condition, specified in terms of operating conditions on the DUT, is detected. Though, the debug commands may specify actions that the test system is to perform independent of the test program commands. Examples of such debug commands include commands to read or set values at internal registers or memory locations within the DUT.

As part of an interface between the debugger and the tester, a translation module may be provided that formats, in real time, debug commands into a format that can be applied to the tester. This format may be a high level format that is independent of the specific protocol used by the DUT. As a result, a generic debugger and interface may be provided that is useful regardless of a specific DUT for which debugging is being performed.

To control a specific DUT, the tester may be programmed with a protocol aware engine configured for the DUT. The protocol aware engine may accept commands specifying, at a high level, operations to be performed by the DUT. The protocol aware engine may generate commands at a lower level to control instruments in the tester to generate or measure signals at the DUT that perform the operation. The protocol aware engine, for example, may generate a test pattern for the DUT. This test pattern may even be generated dynamically, avoiding the need for the test pattern to be generated in advance and stored. For example, a high level operation, such as to read a value from a location within the DUT, may be specified. The protocol aware engine may generate instrument control signals that specify levels and timing of specific signals that access and read the value.

In some embodiments, the translating and formatting process may be repeated in reverse to return a result of executing a debug command to the debugger.

The debugger may in turn present the result to the user or may use it to conditionally generate another debug command. These actions may be performed in real time, meaning that the user will experience the system responding to inputs from the user, without delays of changing a test program and reloading it. The translation module may thus enable a customer to perform debug operations in an interactive manner.

Moreover, in some embodiments, the system may operate using test programs written in native customer code, which can facilitate development of test programs. By allowing the test program to be written in a high-level level programming language, a user may readily edit the test program. Moreover, because execution of the test program can be controlled by debug inputs provided after the test program is written, debug iterations on the DUT or test program can be avoided.

Such a real-time debugging environment may be useful in various applications. For example, the user may be a design engineer or a test engineer testing a new device for the first time, before shipment. Traditionally, test programs or test patterns are created offline by design engineers, and are executed by test engineers to test a DUT. If certain problems occur during testing, then the test engineers and design engineers typically collaborate to try to resolve the problem. This process can take up to days or weeks. Embodiments described herein may shorten the cycle time to generate a suitable test program, by enabling the design engineer and/or the test engineer to edit/modify the test program, and see the results from the DUT in real-time, without having to re-design a new test pattern offline. As a result, the time-to-shipment for new devices may be reduced.

As another example, the user may be a design engineer or a test engineer testing an end product that has been returned from the field. In some cases, a device may have initially been tested as good, but upon running device code in a particular use case, unexpected problems may be encountered (for example, because not all cases were initially tested). It may be difficult to design test patterns to recreate such faults without an understanding of the cause, but it may be difficult to understand the cause without an appropriate test pattern. Often, diagnostic tests are inadequate and may yield a "no fault found" result. However, embodiments described herein may enable a test engineer and/or a design engineer to more efficiently re-create the test case that failed in the field, by interactively performing input-output operations on the device to locate the fault. This interactive debugging may enable more quickly and accurately diagnosing particular problems in a device.

The inventors have recognized and appreciated that interactive debugging may be facilitated by techniques for automatically translating debug commands into a format to control instruments within a tester. In some embodiments, translation may entail translating high-level debug commands into lower-level instrument commands, in real time, in multiple steps. High level debug commands may be translated to high level tester commands, which are then translated to lower level commands that control instruments within the tester.

In some embodiments, the formatted debug command may comprise an instruction that specifies either a deterministic or non-deterministic operation. As examples, the operation may be deterministic if it is related to a protocol, or may be non-deterministic if it is referring to a command for the DUT. In some embodiments, the tester may contain an ATE instrument engine that generates appropriate commands, regardless of whether the debug commands specify a deterministic or non-deterministic operation.

To support the multiple step format translation, a translation module may be provided to perform real-time translation between a debug tool receiving input from a customer and a high level tester command input. In some embodiments, if the debug tool generates debug commands based on customer code or real-time customer input, then the translation module may translate those debug commands into commands recognized by a tester. The tester, in turn, may contain a component that generates binary test pattern stimulus specific to the DUT or other commands to control instruments within the tester. In some embodiments, the tester may contain a protocol aware engine that issues instrument commands for testing the DUT, and based on a response from the DUT, automatically issue subsequent instrument commands.

In some embodiments, the translation module, in combination with the protocol aware engine, may provide various types of indications, for example, that an instrument command was completed, that a test program successfully executed up until a predetermined location, or that an error occurred while executing an instrument command. In response to such indications, the user may enter subsequent high-level instructions that are automatically translated into instrument commands that control the tester to apply a suitable control signal, such as a binary test pattern, to the DUT. This may enable a user to experience real-time, interactive testing of the DUT.

As an example of how these functions may work together, if the debug tool generates a memory read/write debug command, then the translation module may automatically translate this into an appropriate high-level tester command such as, "read data from memory location XXX." The tester, using the protocol aware engine, may recognize this command to generate a suitable binary test pattern that implements the high-level tester command, in accordance with the DUT protocol and timing. The combination of a translation module and a protocol aware engine within the tester may thus provide an abstraction layer that enables the user to be agnostic to the underlying protocol and timing of the DUT, and reduces the need for the user (e.g., a design engineer or a test engineer) to manually generate off-line a test program based on the specific protocol, and in some embodiments, the configuration of the DUT.

The inventors have recognized and appreciated that such a system may have several benefits, including enabling a user to: 1) debug interactively/on-line, without necessarily having to go off-line to develop binary test patterns and then having to move the test patterns back to the test system; and 2) debug using high-level debug commands, reducing the need for intermediate low-level off-line binary test pattern development.

The inventors have recognized and appreciated that, by providing an abstraction layer between debug tools and testers, different types of debug tools may be used with a tester, even if the debug commands issued by the debug tools are independent of the particular protocol used by the DUT. In some embodiments, a translation module may automatically format debug commands in a manner that complies with a particular protocol recognized by the DUT.

The inventors have recognized and appreciated that a real-time interactive debug environment may have several benefits, including, but not limited to, reducing the need for: a) using intermediate tools/steps to convert high level programming language to binary code to be used in the tester; and b) using a test bench to re-create a working environment for the DUT so that a realistic test program can be generated.

Techniques described herein may provide such benefits by enabling a direct and interactive "link" between a debug tool and a tester, without necessarily going off-line. Such a "link" may be enabled, for example, by at least two achievements of embodiments described herein: (1) real-time interactive generation of stimulus signals via an abstract layer that translates high level programming language to binary code; and (2) providing a real-time "test bench," via a protocol-aware or other ATE engine, which can emulate a functionally correct working environment for the DUT.

Figure 1:
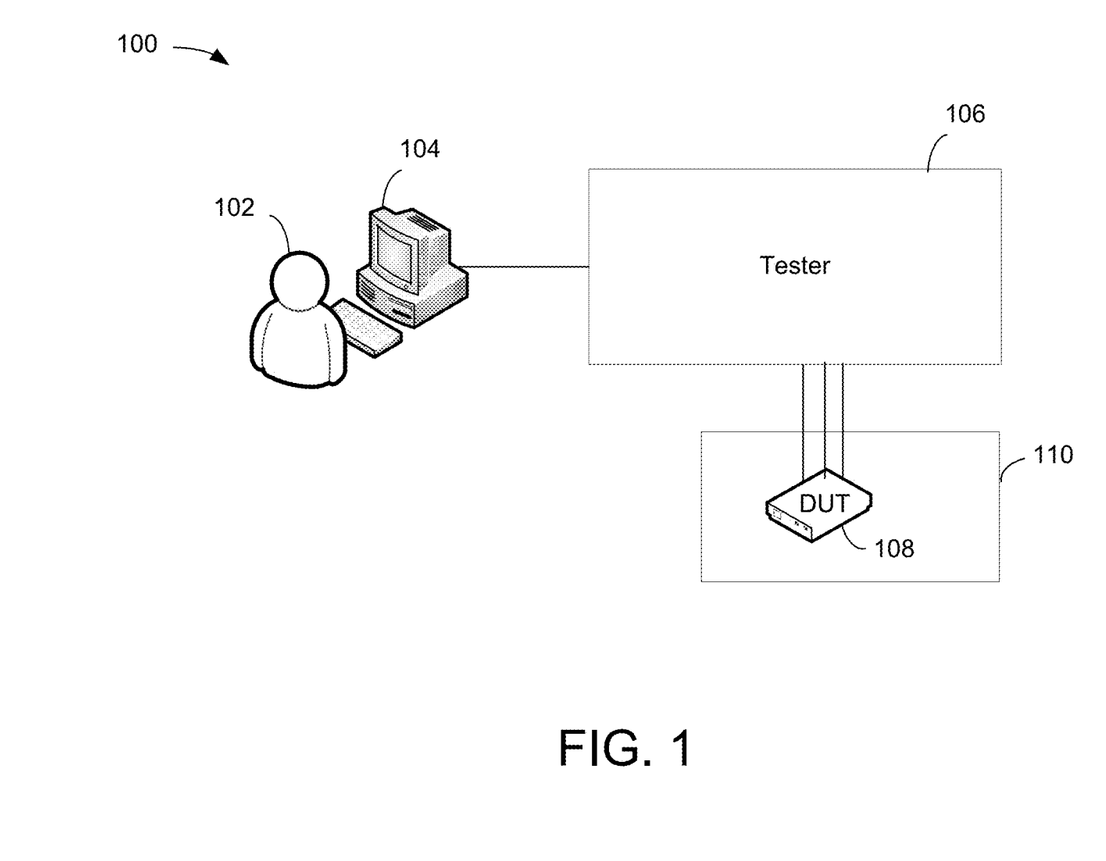
FIG. 1 is a schematic illustration of an exemplary test system, according to some embodiments.

FIG. 1 is a schematic illustration of an exemplary test system 100, according to some embodiments. In FIG. 1, a user 102 (e.g., a design engineer or a test engineer) interacts with a test computer 104. Based on the user input, the test computer 104 controls a tester 106, which performs tests on a device under test (DUT) 108. For example, in some scenarios, the tester 106 may be automated test equipment (ATE), constructed using techniques that are known in the art. The DUT may be any suitable device for testing. In this example, DUT 108 may be a semiconductor device. The semiconductor device, for example may be a system on chip (SOC) containing a processor and one or more functional sections.

DUT 108 may be placed in a socket 110 for testing. Though, it should be appreciated that a test system as described herein my test any suitable type of device, and different types of devices may be held in different types of fixtures for testing. Moreover, though not shown, any number of devices may be placed in the socket 110 for concurrent testing. Accordingly, socket 110 is exemplary and not limiting of the invention.

Further, it should be appreciated that other components as illustrated are exemplary rather than limiting. For example, although the test computer 104 is illustrated as a personal computer (PC) in FIG. 1, it should be appreciated that any suitable computing device may be used to implement a test computer, for example, a hand-held portable device or a computer work station.

The test computer 104 may have software that implements debug tools. These debug tools may operate in conjunction with a test program, which may be written as high-level code for testing DUT 108. The high-level code, for example, may be specified independently of a specific protocol used for exchanging information with a DUT and independent of the specific instruments within tester 106 that will generate and measure signals at the DUT. Values of some parameters in the test program may specify components within the DUT on which certain operations are to be performed. Operations to be performed may be specified in the high-level code in a way that generically applies to any DUT and tester configuration. The operations, for example, may relate to reading or writing values.

The debug tools, collectively may provide a debugger, and may be implemented using techniques as are known in the art to support any suitable debug operations. These debug operations may include debug operations as are known in the art. For example, the debug operations may include stepping through the test program or setting a break point in the test program where execution will stop. The debug operations may also include setting trap conditions, indicating conditions on the DUT that may result in execution of the test program from stopping. Moreover, debug operations may include reading or setting values in registers or other components within a DUT.

The debug tools in the test computer 104 may output debug commands based on the user input and/or the test program. The output of debug commands may also be based on values read from the DUT or state of the test system. Information read from the DUT or state of the test system may be provided by tester 106. For example, when user input has indicated single step operation through a test program, the debug tools may generate a debug command, indicating execution of a step in the test program. When the debug tools receive information back from tester 106 indicating that the step was completed, the debug tools may generate a debug command or commands to specify execution of the next step in the test program.

In some embodiments, a translation module may be provided in the test computer 104 that translates debug commands issued by the debug tools into tester commands recognized by the tester 106. Based on the tester commands received from test computer 104, the tester 106 may generate control signals, such as a binary test pattern, and apply the control signal to the DUT 108 to run in some debug scenario.

The translation module in the test computer 104 may allow a variety of debug tools to be implemented with the tester 106. A translation module may provide an abstraction layer between the user-level instructions and the tester-level commands. Such a translation module may allow the user 102 to be agnostic to the exact nature and requirements of the tester 106 and/or the DUT 108. This may provide a more generalized methodology for debugging a broader variety of DUTs, as compared to using specific debugging instrumentation that is compatible with a particular tester and/or DUT.

In addition to providing an abstraction layer between debug tools in the test computer 104 and the tester 106, the translation module in test computer 104 may also enable the user 102 to perform real-time interactive debugging of the DUT 108. Such real-time interactive debugging may enable the user 102 to interactively control the tester 106. For example, the user 102 may perform a sequence of stimulus-response operations with the DUT 108, or may run, in real-time, a test program commands, or specific commands in the test program, based on signals output by the DUT 108.

Because the debug tools allow commands from a test program to be dynamically selected and applied to tester 106, there is no need for the test program to be prepared in advance. To the contrary, the test program may be developed or modified on the fly. In this case, on the fly modifications occur as the DUT is being tested. Such modifications to the test program are thus made in an online manner. Such online programming and modification is more powerful than a conventional approach of preparing a test program off line, while not testing a DUT, and then loading the prepared program for execution.

Therefore, such a translation module may not only provide a layer of abstraction enabling the user 102 to use high-level customer code, but may also provide a real-time interactive environment in which the user 102 may dynamically perform debugging, based on response signals output by the DUT 108. While the example of FIG. 1 has been described as implementing the translation module in test computer 104, it should be appreciated that embodiments are not limited in this regard, and the translation module may be implemented in any suitable computing device.

Figure 2:
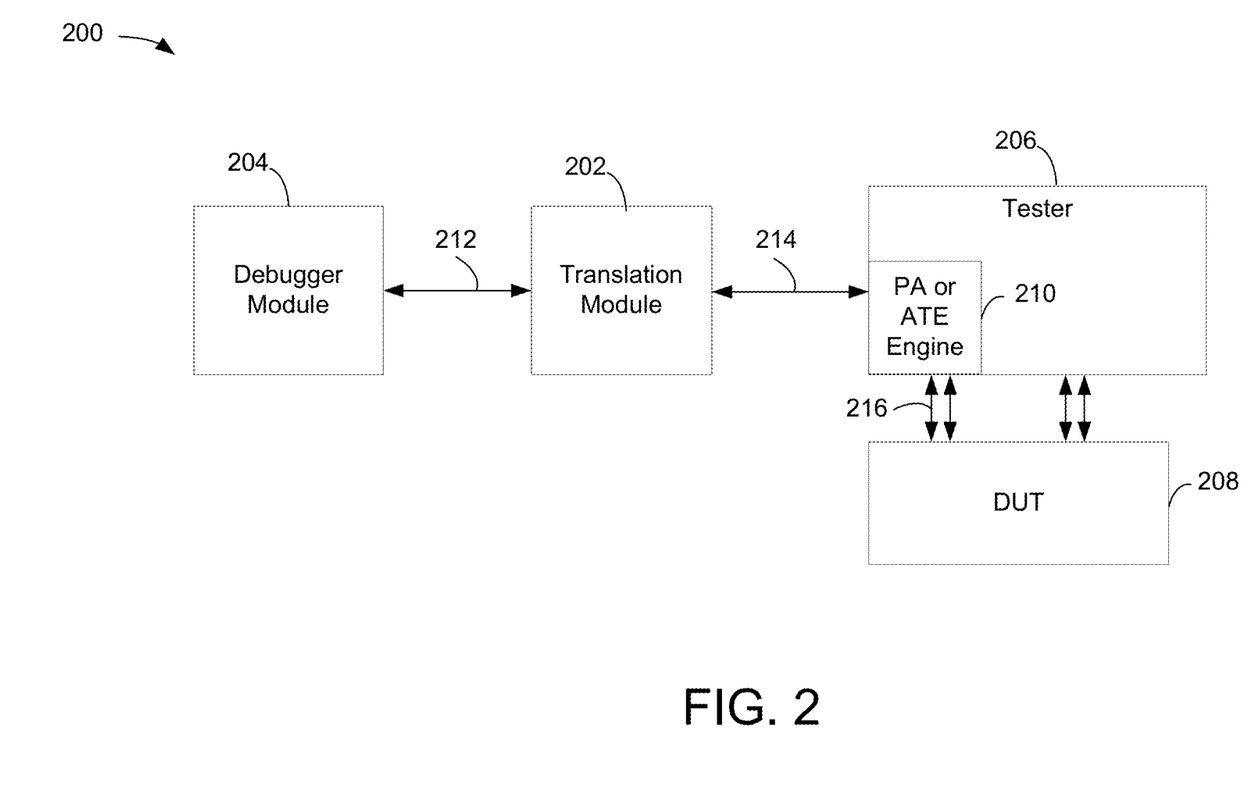
FIG. 2 is a schematic illustration of an exemplary test system showing details of a translation module and a tester, according to some embodiments.

FIG. 2 is a schematic illustration of an exemplary test system 200 using a translation module, according to some embodiments. In this example, further details of an abstraction layer between a debugger module and test system instruments that generate and measure signals at a DUT is provided. In this example, a protocol aware engine 210 is further provided. The protocol aware engine converts high level tester commands, created by the translation module 202 from debug commands, into instrument commands that control operation of the instruments within tester 206 to apply or measure signals at DUT 208.

In the embodiment of FIG. 2, translation module 202 provides an interface between a debugger module 204, implementing one or more debug tools, and a tester 206, performing tests on a DUT 208. In some embodiments, the translation module 202 enables the use of a test program written in a customer language (e.g., C++, Java) to interactively debug the DUT 208. In some embodiments, the translation module 202 may be or may be implemented within an application programming interface (API) between the debugger module 204 and the tester 206.

Debugger module 204 may be implemented in any suitable way, including using third-party debug tools, which may be designed to understand the logic of what a user wants to do with the DUT 208. These debug tools may interact with customer code, implementing a test program, supplied by the user. Based on the user input, the test program and/or measurements or other information provided by tester 206, the debugger module 204 may generate debug commands 212. For example, the debugger module 204 may generate debug commands 212 comprising a command to perform an operation on the DUT 208. In some embodiments, a single user input to debugger module 204 may result in a stream of debug commands. For example, user input, indicating a command to load software into a memory on DUT 208 may result in a stream of debug commands 212.

The debug commands 212 issued by the debugger module 204, however, may not be in a format suitable for direct application to the tester 206. For example, the debug commands 212 may be in a high-level programming language that was not specifically prepared for tester 206. The translation module 202 may provide the necessary translation between debug commands 212 and tester commands 214.

These tester commands 214 may still be at a relatively high level. The tester commands 214, for example, may specify reading and writing at a location within the DUT, but not a specific series of values that would be required to DUT 208 to cause the specified operation to be performed. The abstraction layer in system 200 may further include a component to convert the higher level tester commands 214 to lower level instruments commands that control the instruments within tester 206 to generate or measure the appropriate signals.

Such a component may include a tester control module. For example, the tester control module may be a protocol-aware (PA) engine 210. Though, it should be appreciated that other suitable ATE engines may be used as a tester control module, such as a Digital Signal Source and Capture (DSSC). In some embodiments, the PA engine 210 may be configured to generate instrument commands 214, which cause the instruments inside the tester to generate a sequence of bits 216 to control the hardware in the DUT 208 to perform an operation specified by a tester command, which was generated in response to one or more debug commands 212.

Examples of a protocol aware engine may be found in U.S. Pat. No. 8,195,419 and application 2010/0312516, the entireties of which are hereby incorporated by reference. However, any suitable component that converts a tester command into commands that control instruments that generate signals, with appropriate levels and timing, for application to a specific DUT, may be used. The protocol aware engine may operate in accordance with protocols that generate signals at times or with values depending on the state of signals generated on the DUT. For example, a DUT may assert a "ready" signal when data is available to be read, and the protocol aware engine may, in response to such a ready signal, issue instrument commands that cause the value to be read. In some embodiments, the protocol aware engine may operate on digital signals. Though, it should be appreciated that a protocol engine may, in some embodiments, operate on analog and/or digital signals.

Accordingly, it should be appreciated that any suitable tester control module may act as a PA engine 210. Moreover, any suitable module that converts higher level tester commands to instrument commands that control generation of DUT signals may act as a PA engine 210.

While it is known to provide a tester with a PA engine 210, to convert between tester commands 214 and control signals to instruments, the translation module 202 and PA engine 210 may provide additional abstraction. Such additional abstraction may, for example, enable a user to use a higher-level, more user-friendly, programming language, i.e., the customer's language (such as C, C++, Java) to prepare a test program. Moreover, it allows a test system that can readily be configured to operate with any test system or DUT. Debugger module 204 may product a generic output, regardless of tester or DUT. Translation module 202 may be specific for a tester, but independent of the DUT. Though, PA engine 210 may be configured for a specific DUT.

Figure 3:
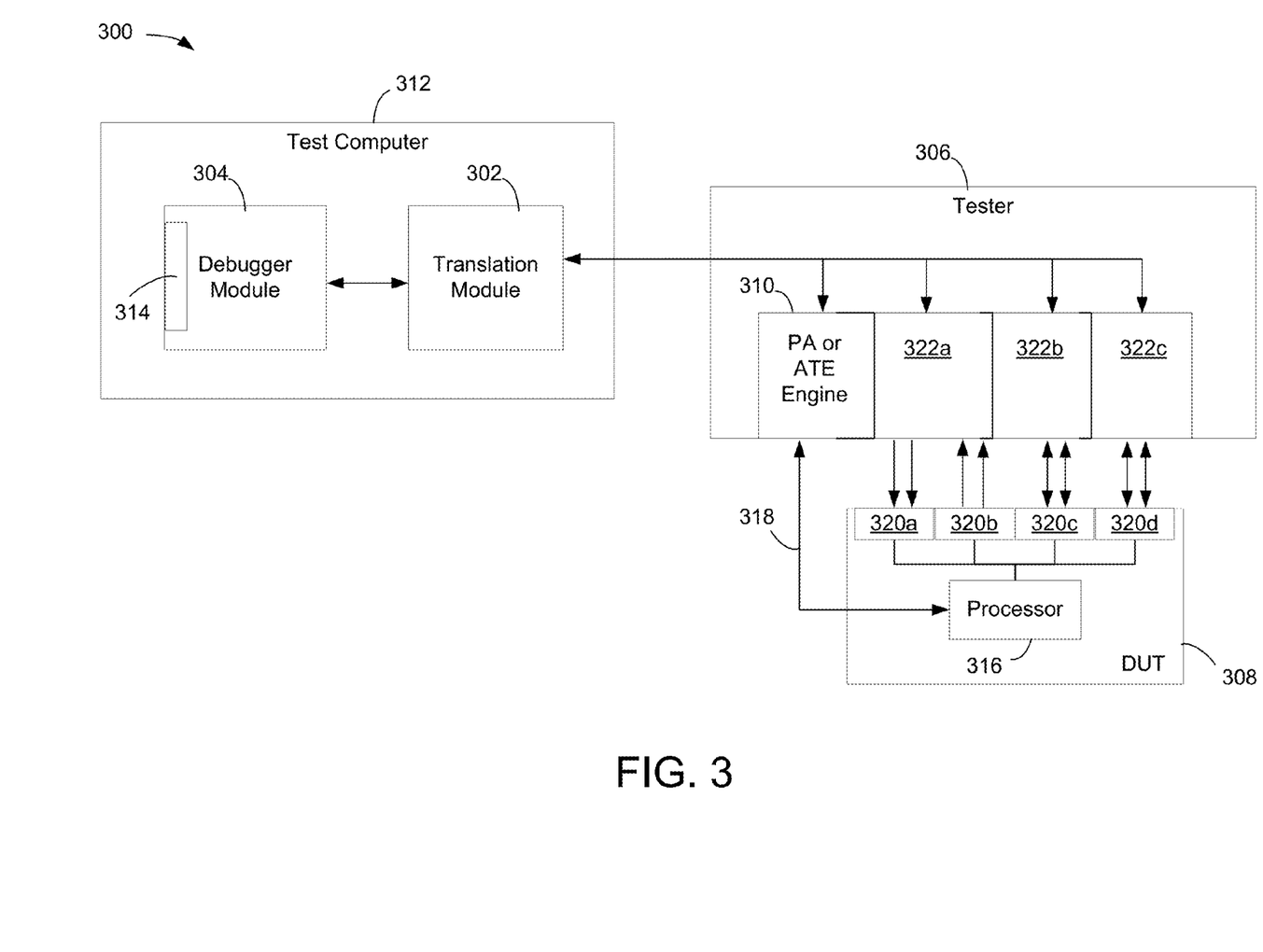
FIG. 3 is a schematic illustration showing further details of an exemplary test system, according to some embodiments.

FIG. 3 is a schematic illustration showing further details of an exemplary test system 300, according to some embodiments. FIG. 3 illustrates a translation module 302 that provides an abstraction layer between the debugger module 304 and a tester 306 for controlling a DUT 308. The tester 306 may, in some embodiments, comprise a PA engine 310, for receiving tester commands from the translation module 302 and, in response, generating instrument commands that will cause instruments within tester 306 to generate or measure signals from DUT 308.

In some embodiments, the translation module 302 and debugger module may be configured in a test computer 312 (e.g., test computer 104 in FIG. 1), although embodiments are not limited in this regard. The debugger module 304 may have a user interface 314, through which a user may interact with various debug tools implemented by the debugger module 304.

In some embodiments, user inputs may control the debug tools to generate debug commands that ultimately cause a digital instrument to control a processor 316 of the DUT 308, via a line 318 operating according to a protocol supported by PA engine 310. In some embodiments, that protocol may be in accordance with the Joint Test Action Group (JTAG) protocol, which allows control of components through a test interface with a limited number of pins, such as a serial input and a serial output pin, a timing pin and one or more control pins. The JTAG protocol may allow a program to be loaded into memory inside DUT 308 or values to be loaded into specific registers or storage locations. Similarly, the JTAG protocol may allow values to be read from specific registers or storage locations within DUT 308. It should be appreciated, however, that embodiments are not limited to using JTAG, as other suitable protocols, such as Mipi, SPI, I2C, may be used to control the DUT.

This capability to load programs may be used, for example, to allow the debug tools to load test code into the firmware associated with processor 316. The test code may perform operations conditionally, based for example on values written to specific locations in memory of the DUT. Alternatively or additionally, the test code may write values into locations in memory. These capabilities may be used to control the timing or progressions of operations performed by DUT 308 and also to provide the tester 306 access to results of performing operations. These capabilities might be used, for example, to implement debug commands that specify control over operation of a test program. In this way, the system may support, for example, single step execution of a test program in which a user may examine results of performing each step. This capability may also support execution to a break point or trapping on a specific condition, which may be based on values inside DUT 308.

The capability to load programs for processor 316 also may allow processor 316 to control other processors or subsystems in the DUT 308 to perform operations that serve as tests for DUT 308. For example, in FIG. 3, subsystems 320a, 320b, 320c, and 320d, are shown. Non-limiting examples of a subsystem include an analog to digital converter (ADC), a digital to analog converter (DAC), a Serdes or other cores typically contained in a mixed signal system-on-a-chip. Users may use their code/program, implemented in the processor 316 of the DUT 308, to control these subsystems of the DUT 308. As a non-limiting example of the type of control that is possible, the DAC may be controlled to generate an output of a specific level, which the ADC may be controlled to measure. By comparing the measurement to the expected value, improper operation of the ADC or DAC may be detected.

In addition or as an alternative, other instruments of the tester 306, such as instruments 322a, 322b, and 322c, may be controlled to perform stimulus and/or capture of subsystems, such as subsystems 320a-320d, in the DUT 308. The instruments may be controlled directly from tester commands or may be controlled indirectly from commands issued by another component, such as PA engine 310. This control may be synchronized with test operations performed by processor 316.

Regardless of the nature and source of this control, instruments 322a-322c of the tester 306 may generate and/or measure signals at the DUT 308, based, directly or indirectly, on the tester commands received from the translation module 302. For example, this may be used for RF, AC, DC, and digital instrument families.

In the embodiment described above, a protocol used by the PA engine 310 to communicate with the DUT 308 may be the Joint Test Action Group (JTAG) protocol over a 4-wire line, as is known in the art (IEEE standard 1149.1). Though, it should be appreciated that any suitable protocol family may be used, such as Mipi, SPI, I2C, as embodiments are not limited in this regard.

The processor 316 in the DUT 308 may be configured to receive test code and store it in firmware. Though, the test code may be stored within DUT 308 in any suitable way. Further, it was described that processor 316 may be programmed so that it can be controlled to perform single step operation through a user test program. In some embodiments, processor 316 may be controlled to step through test code loaded into DUT 308, with results available to tester 306 (such that they then may be available to debugger module 304) after each step. Such capability may exist in DUT processors as are known in the art. For example, if the processor 316 is an ARM processor, then it may have a defined control interface to a control protocol, and the ability to step through test instructions. For example, the control interface may be an interface to JTAG or another suitable control protocol. In some embodiments, the DUT processor 316 has debug support capability, and the translation module 302 is able to issue instrument commands to access the debug support capabilities in the processor 316.

Regardless of which components perform testing, measurements made during such testing may be returned to the debugger module 304 through translation module 302. When information is passed through translation module 302 in this direction, it may be converted from high level tester information, such as values read or status obtained from DUT 308, indicating a result of applying one or more debug commands. The debugger module 304 may take the results of such testing and provide various outputs.

In the embodiment illustrated, these outputs are provided at the user interface 314. Such outputs may indicate the result of reads, writes or other operations performed by different subsystems 320a-320d of the DUT 308. For example, if subsystem 320a is an analog-to-digital converter (ADC), then the input to the DUT 308 may represent a captured analog waveform. Such a waveform may be captured, for example, by operation of test code loaded in the DUT to control processor 316 to prepare the ADC to capture the analog input waveform. Accordingly, a waveform may be captured, in response to a user input indicating capture of a waveform. Translation module 302 may convert that command into high level tester commands to cause the loading of test code for processor 316, triggering that test code to execute and then controlling one more instruments within tester 306 to read the resulting data. The data may thus be provided to the user, allowing the user to observe whether DUT 308 accurately measured an analog signal applied to DUT 308. The user might then, in response to the observed data, input additional commands. Regardless of the exact nature of the user input, however, the components illustrated may enable an interactive test environment in which the components are controlled, in real-time, by user instructions.

Figure 4:
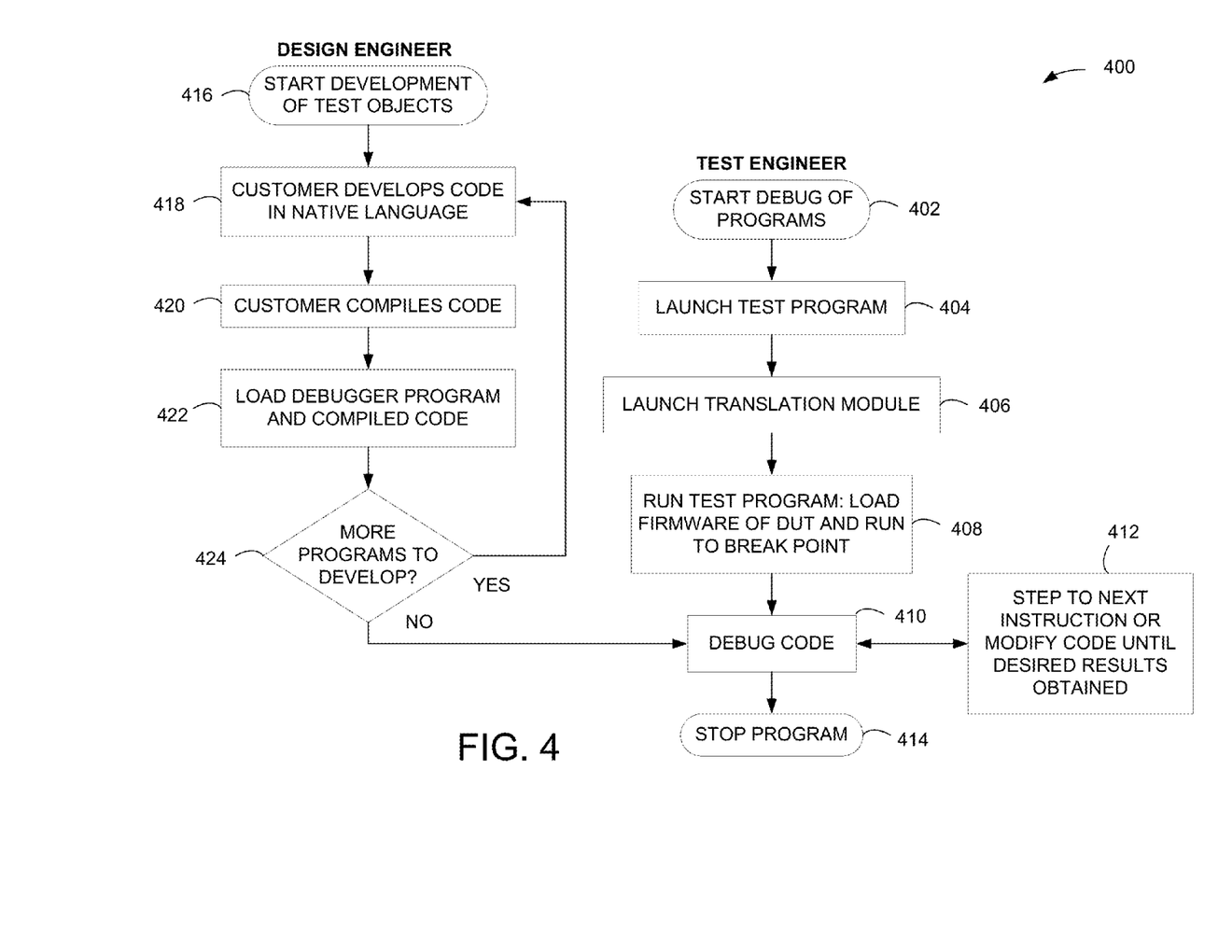
FIG. 4 is a flow chart of a process of development and debug of test programs, according to some embodiments.

FIG. 4 is a flow chart of a debug process, which in this example includes development and debug of a test program, according to some embodiments. In the exemplary process 400 of FIG. 4, interaction of process steps taken by a design engineer and by a test engineer are shown. In both paths, components as described herein may be used to enable real-time interactive debugging of a DUT.

A test engineer may components as described herein to perform interactive debugging of a DUT. In step 402, the test engineer may begin debugging with an existing test program. The test program may be, for example, a test program that is intended to control operation of a test system while testing DUTs as they are manufactured. Though, before such a test program may be used, it may be debugged to ensure that the results of any tests performed according to that program accurately characterize a DUT.

In step 404, the test engineer launches the test program, and launches the translation module in step 406. The translation module may convert instructions derived from the test program, in step 408, for application to a test system. These instructions may be selected by a debugger module in response to user input. The instructions may be selected in any suitable way.

Part of the execution of the test program may be controlled by firmware code loaded onto the DUT, which controls execution of an internal processor. Accordingly, the process 400 may include loading firmware into the DUT. This firmware may be executed as part of executing the test program in accordance with debug inputs, such as by running the test program until a break point, as illustrated in act 408.

At that point, the user may begin interactively debugging the test program at act 410. Interactive debugging may entail user input such as input specifying portions of the test program to execute, setting conditions on the DUT to create test scenarios or reading values from the DUT. For example, the interactive debugging may comprise, in step 412, stepping to the next test program command, or instruction, of the test program. At each step, the user may again specify further actions. In some embodiments, the user may modify the test program (using and editor or other program modification commands), until a desired or expected result is obtained when running the test program to test the DUT. Once the debugging is complete, the interactive debugging may be stopped in step 414.

In some scenarios, a test program may be provided by a design engineer. For example, the design engineer may develop test programs designed to test a particular subsystem or real-use scenario in a device. The translation module may enable testing and debugging of such designed program by either a test engineer or the design engineer.

For example, in step 416, a design engineer may begin development of test objects. The test objects may be test programs, or portions of test programs. These objects may be written in a high-level language native to the user, such that the objects need not be dependent on the language used to control a tester or the specific protocol used by the DUT. Such program objects may be designed to test various functionalities of the DUT. As a non-limiting example, the test program may comprise test program commands for writing data into a register of the DUT and reading an output at a port of the DUT.

In step 418, the design engineer may develop the code in a native language (such as C++ or Java). If written in a compiled language, the code may then be compiled in step 420. Once the code has been compiled, in step 422, the compiled code may be loaded into a test system computer. In the embodiment illustrated, the designer may also load a debugger module as described above. The steps of writing, compiling, and loading customer developed code may be repeated by the design engineer until each developed rest program object performs as desired.

The program, made up of the developed program objects, may then be debugged. This debugging may be performed by the design engineer or the test engineer, using steps as described above. The program objects may be tested at act 410 by any suitable party, including the design engineer or test engineer, as described above. This debugging may entail use of the components, including a translation module and PA engine, as described above, to abstract the implementation details of the DUT from the debug commands generated by debug tools.

A system as described herein may therefore provide an integrated environment in which both design and test engineers may interactively use high-level customer code test programs. This may allow both a design engineer and a test engineer to be more self-sufficient, and reduce the cycle time in developing test programs to accurately test or diagnose devices.

Figure 5:
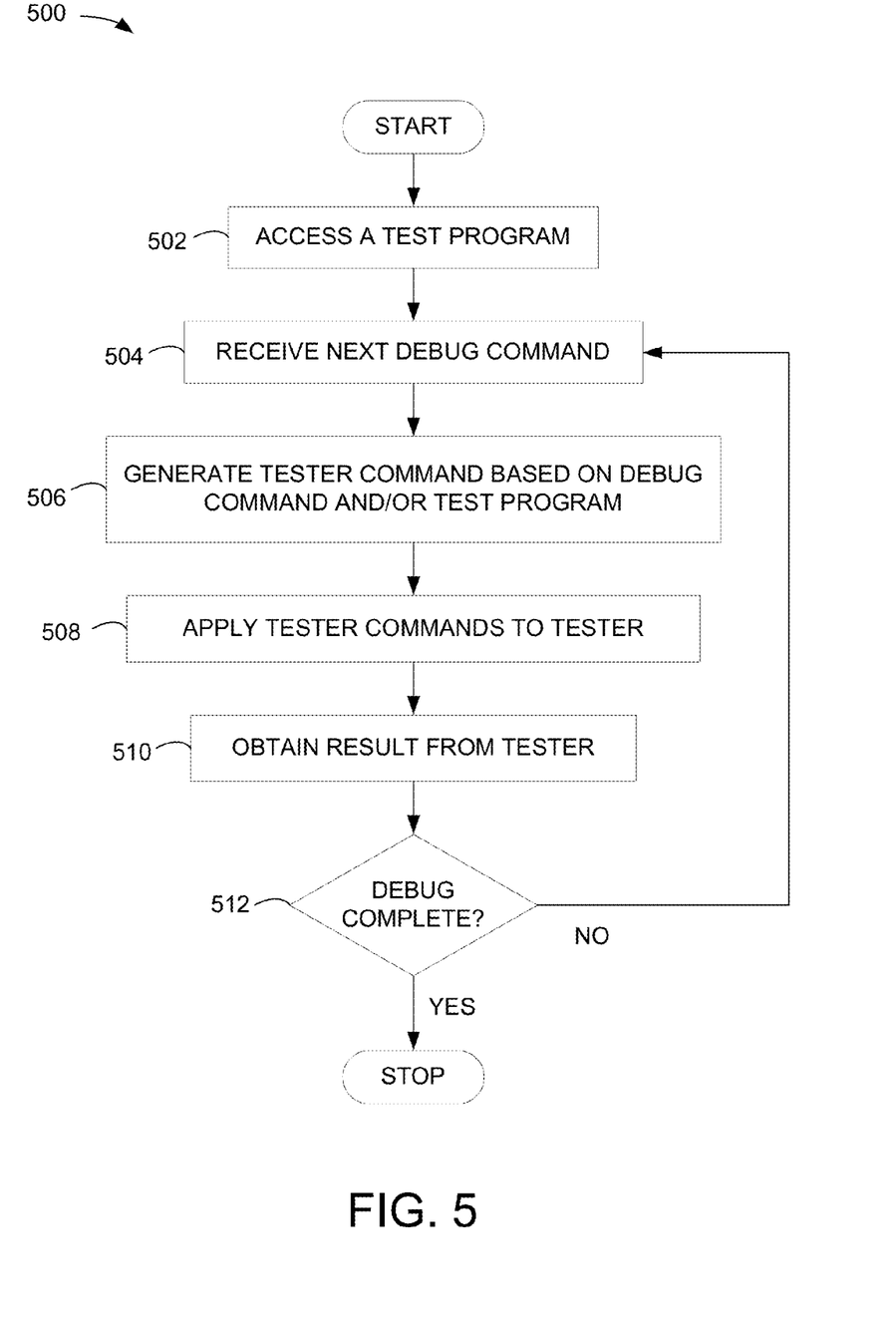
FIG. 5 is a flow chart of a method of using a translation module to interactively apply debug commands to a device under test, according to some embodiments.

FIG. 5 is a flow chart of a method involving operation of a translation module (e.g., translation module 202 or 302 in FIGS. 2 and 3) as part of interactively applying debug commands to a device under test in real time, according to some embodiments. In the exemplary process 500, a debug module accesses a test program in step 502, which may comprise test program commands written in a high-level customer language. In response to user input, the debug module may generate debug commands based on the loaded test program, and possibly user input and other information.

In step 504, the translation module may receive a debug command, for example, from a debugger module (e.g., debugger module 204 or 304 in FIGS. 2 and 3). The debug command may represent an instruction in the test program, and/or may represent a real-time user-input instruction.

Regardless of the exact nature of the debug command, the translation module may, in step 506, generate a tester command recognized by a tester (e.g., tester 206 or 306 in FIGS. 2 and 3). In step 508, the translation module may apply the tester command to the tester, and the tester may perform various input/output operations on the DUT, using an appropriate protocol. The tester may decide how to apply the tester commands to the DUT by using a DUT-aware PA engine (e.g., PA engine 210 or 310 in FIGS. 2 and 3). The tester may then get a result of the instruction, which it passes to the translation module in step 510, which may in turn be provided to a user through an interface implemented by a debugger.

In step 512, if the debugging of the program is complete, then the process may complete. Otherwise, the process returns to step 504 and the translation module may receive the next debug command, either from the next instruction in the customer code, or from another real-time user-input instruction. In this way, the debug commands are provided to the translation module and then executed by the tester without requiring test patterns, for example to be generated in advance and stored in the tester hardware. As a result, it appears to the user that as debug commands are executed in real-time, as they are generated.

The translation module may thus provide a layer of abstraction for a debug tools, and a user using the debug tools, that hides the details of the tester. Likewise, the PA engine, and the DUT-specific protocols necessary to communicate with the DUT, hides the details of control signals necessary to interact with the DUT. These components enable the debug tools to more simply interface with the DUT and/or test system using commands native to the debug tools. As such, a user is able to perform high-level interactive debugging in an online manner, without having to rely on offline generation of low-level binary test patterns for the tester and DUT.

Figure 6:
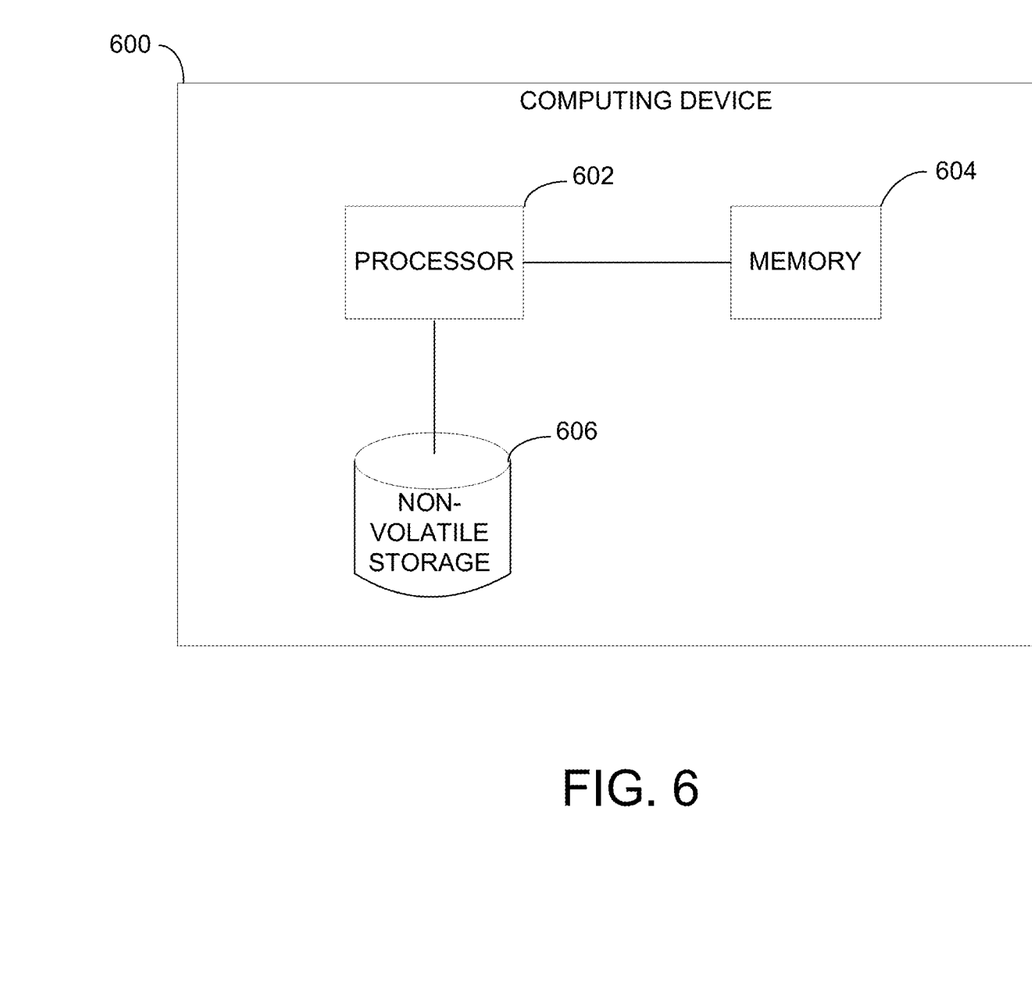
FIG. 6 is a schematic illustration of a representative computing device that may be used to implement one or more of the techniques described herein.

FIG. 6 is a schematic illustration of a representative computing device 600 that may be used to implement one or more of the techniques described herein, either to perform translation of debug commands into instrument commands (e.g., translation module 202 or 302 in FIGS. 2 and 3) or to provide a user with interactive debugging of a DUT (e.g., test computer 104 or 312 in FIGS. 1 and 3). Computing device 600 may also represent the DUT itself (e.g., DUT 208 or 308 in FIGS. 2 and 3). Computer device 600 may include one or more processors 602 and one or more non-transitory computer-readable storage media (e.g., memory 604 and one or more non-volatile storage media 606). The processor 602 may control writing data to and reading data from the memory 604 and the non-volatile storage device 606 in any suitable manner, as the aspects of the invention described herein are not limited in this respect. To perform functionality and/or techniques described herein, the processor 602 may execute one or more instructions stored in one or more computer-readable storage media (e.g., the memory 604, storage media, etc.), which may serve as non-transitory computer-readable storage media storing instructions for execution by the processor 602. Computing device 600 may also include any other processor, controller or control unit needed to route data, perform computations, perform I/O functionality, etc.

In connection with the transformation techniques described herein, one or more programs that debug programs, translate debug commands into instrument commands, or provide an interactive debugging environment, may be stored on one or more computer-readable storage media of computing device 600. Processor 602 may execute any one or combination of such programs that are available to the processor by being stored locally on computing device 600 or accessible over a network. Any other software, programs or instructions described herein may also be stored and executed by computing device 600. Computer 600 may be a standalone computer, mobile device, etc., and may be connected to a network and capable of accessing resources over the network and/or communicate with one or more other computers connected to the network.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention.

For example, though a debugger and translation module are shown to be separate components. This implementation is shown for simplicity of explanation. The specific architecture of these components is not critical to the invention.

For example, translation may be performed as part of the debug module. Alternatively or additionally, some or all of the debug commands supported by a system may be implemented within a translation module.

More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified unless clearly indicated to the contrary. Thus, as a non-limiting example, a reference to "A and/or B," when used in conjunction with open-ended language such as "comprising" can refer, in one embodiment, to A without B (optionally including elements other than B); in another embodiment, to B without A (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. At least one non-transitory computer-readable storage medium comprising computer-executable instructions that, when executed on at least one processor of a computing device, implement a debug method on a device under test (DUT), the method comprising:

interactively receive debug inputs from at least one human operator through a user interface of the computing device, wherein the debug inputs comprise instructions in a native language of a third party tool;

access a test program, the test program comprising a plurality of test program commands, wherein the debug inputs comprise at least one command to suspend execution of the test program at a predetermined location within the test program; and control automatic test equipment, comprising a plurality of instruments, to:

select from a plurality of protocols a protocol associated with the DUT based on a response received from the DUT;

generate instrument commands configured to control the plurality of instruments to stimulate a device under test (DUT) and receive responses from the DUT in accordance with the debug inputs and the test program commands, wherein instrument commands are generated, at least in part, based on the selected protocol associated with the DUT, wherein:

generate instrument commands configured to control instruments in accordance with the debug inputs and the test program commands comprises generating instrument commands configured to control instruments to perform test program commands in the test program up until the predetermined location; and apply the instrument commands to instruments in the automatic test equipment, wherein the instrument commands specify at least one of levels and timing of a signal generated by the instruments.

2. The non-transitory computer-readable storage medium of claim 1,
wherein:
interactively receiving debug inputs comprises:
receiving a first and a second debug input from the user interface,
generating a first debug command in accordance with the first debug input,
applying the first debug command to the automatic test equipment, and
in response to a result of applying the first debug command to the automatic test equipment, generating a second debug command in accordance with the second debug input.

3. The non-transitory computer-readable storage medium of claim 1, wherein:
interactively receiving debug inputs comprises generating the instrument commands in real time following receipt of the debug inputs.

4. The non-transitory computer-readable storage medium of claim 1, wherein:
stimulating a DUT and receiving responses from the DUT are configured to be performed in accordance with a functionally correct working environment for the DUT.

5. The non-transitory computer-readable storage medium of claim 1, wherein:
the computer executable instructions that generate instrument commands comprise computer-executable instructions for translating the debug inputs and test program commands into a binary test pattern.

6. The non-transitory computer-readable storage medium of claim 1, wherein the debug method further comprises:
presenting to the user an indication that test program commands in the test program up until the predetermined location were executed.

7. The non-transitory computer-readable storage medium of claim 1, further comprising:
computer-executable instructions that, when executed, receive program modification commands from the user of the computing device and modify the test program based on the received program modification commands.

8. The non-transitory computer-readable storage medium of claim 1, wherein:
the debug inputs comprise at least one command to read data from the DUT;
the debug inputs are independent of a protocol for reading data from the DUT.

9. The non-transitory computer-readable storage medium of claim 1, further comprising the test program, wherein:
the test program comprises instructions for execution on a processor within the DUT to control the processor to interact with a core on the DUT to generate and/or measure test data relating to the core.

10. The non-transitory computer-readable storage medium of claim 1, wherein:
the third party tool is a third party tool used by design engineers.

11. A method of operating automatic test equipment to test a device under test (DUT), the method comprising:
with at least one debug tool, receiving user input with a user computer executing a design engineering tool and, in response to the user input, generating a plurality of debug commands;
receiving the plurality of debug commands at an application programming interface;
within the application programming interface, formatting, in real time, the plurality of debug commands in a first programming language independent of the DUT for application to a test system, wherein the formatted debug commands comprise at least one instruction specifying a non-deterministic operation;
applying the formatted commands to the automatic test equipment; and
within the automatic test equipment, generating a plurality of instrument commands in accordance to the formatted commands and controlling one or more instruments to stimulate a device under test and measure responses of the device under test in accordance with the plurality of instrument commands and protocol information associated with a device under test, wherein the instrument commands specify at least one of levels and timing of a signal generated by the instruments, wherein
controlling the one or more instruments comprises generating commands in a second programming language configured to control the one or more instruments to generate or measure signals at the DUT.

12. The method of claim 11, wherein:
stimulating a device under test and measuring responses of the device under test are configured to be performed in accordance with a functionally correct working environment for the device under test.

13. The method of claim 11, wherein:
formatting the plurality of debug commands comprises generating a plurality of high level instrument commands.

14. The method of claim 11, wherein:
controlling one or more instruments comprises generating a binary test pattern based at least in part on high level instrument commands and the protocol information.

15. The method of claim 11, wherein:
controlling the one or more instruments within the automatic test equipment comprises operating a protocol aware engine or instrument engine within the automatic test equipment to generate signals to stimulate the device under test at times determined by responses from the device under test.

16. The method of claim 15, further comprising:
configuring the protocol aware engine or instrument engine based on protocol information associated with the device under test such that the debug commands are independent of protocols used by the device under test.

17. The method of claim 11, further comprising:
receiving at the interface an indication that execution of a first formatted debug command was completed.

18. The method of claim 17, wherein the first formatted debug command comprises an instruction specifying a non-deterministic operation by the device under test.

19. The method of claim 11, wherein:
the device under test comprises a processor core; and
the plurality of debug commands comprise a command to load a test program into the device under test through a JTAG interface or other control interface, the test program being formatted for execution by the processor core to control the processor core to perform test functions involving interaction with one or more other subsystems in the device under test.

20. The method of claim 19, wherein:
controlling the one or more instruments within the test system comprises controlling the one or more instruments to:

generate signals that control execution of a portion of the test program by the processor core; and measure signals output by the device under test at times synchronized with execution of the portion of the test program.

21. A test apparatus comprising:

a plurality of instruments disposed within automatic test equipment, each of the instruments configured to generate and/or measure at least one signal for application to a device under test;

a tester control module within the automatic test equipment, the tester control module comprising an input, wherein the tester control module comprises a protocol aware engine configured to generate, in real time, control signals that control the plurality of instruments to generate and/or measure at least one non-deterministic signal for application to the device under test based on instrument commands received through the input, wherein the instrument commands specify at least one of levels and timing of a signal generated by the instruments; and at least one processor configured to implement:

a debugger module, the debugger module comprising an interface, wherein the debugger module is configured to execute at least one debug tool in response to information received through the interface to generate debug commands; and a translation module coupled between the debugger module and the tester control module, wherein the translation module is configured to:

receive a first set of debug commands from the debugger module;

generate, based on the first set, a second set of instrument commands;

apply the second set to the input of the tester control module in real time in relation to receipt of the first set of debug commands; and convert information from the tester control module into a format of the debugger module indicating a result of applying the second set of debug commands.

22. The test apparatus of claim 21, wherein:

the tester control module is further configured to generate, in real time, control signals in accordance with a functionally correct working environment for the device under test.

23. The test apparatus of claim 21, wherein:

the at least one processor comprises at least a first processor and a second processor;

the first processor is configured to implement the debugger module;

the second processor is disposed within the automatic test equipment; and the second processor is configured to implement the tester control module.

24. The test apparatus of claim 21, wherein:

the tester control module comprises at least one protocol aware engine or instrument engine.

25. The test apparatus of claim 21, wherein:

the tester control module is further configured to:

generate the control signals from the instrument commands received through the input in a plurality of protocols; and receive a control signal selecting a protocol of the plurality of protocols.

26. The test apparatus of claim 21, wherein:

the debugger module is configured to generate debug commands in a format that is independent of a format of the instrument commands.

* * * * *